United States Patent [19]
Matteson et al.

[11] Patent Number: 5,959,923
[45] Date of Patent: Sep. 28, 1999

[54] DIGITAL COMPUTER HAVING A SYSTEM FOR SEQUENTIALLY REFRESHING AN EXPANDABLE DYNAMIC RAM MEMORY CIRCUIT

[75] Inventors: Keith D. Matteson; Michael L. Longwell, both of Austin; Terry J. Parks, Round Rock, all of Tex.

[73] Assignee: Dell USA, L.P., Round Rock, Tex.

[21] Appl. No.: 08/058,822

[22] Filed: May 7, 1993

Related U.S. Application Data

[63] Continuation of application No. 07/540,049, Jun. 19, 1990, abandoned.

[51] Int. Cl.⁶ ............................................ G11C 7/00
[52] U.S. Cl. .................. 365/222; 365/222; 365/230.03; 711/5; 711/106
[58] Field of Search .............................. 365/222, 230.03; 711/5, 106

[56] References Cited

U.S. PATENT DOCUMENTS

| | | | |
|---|---|---|---|
| 4,185,323 | 1/1980 | Johnson et al. | 365/222 |
| 4,249,247 | 2/1981 | Patel | 364/900 |
| 4,357,686 | 11/1982 | Schueneman | 365/222 |
| 4,403,308 | 9/1983 | Girard | 365/222 |
| 4,556,952 | 12/1985 | Brewer et al. | 364/900 |
| 4,594,656 | 6/1986 | Moffett | 364/200 |
| 4,601,018 | 7/1986 | Baum et al. | 365/189 |
| 4,625,301 | 11/1986 | Berger | 365/222 |
| 4,691,303 | 9/1987 | Churchward | 365/222 |
| 4,706,221 | 11/1987 | Satoh et al. | 365/222 |
| 4,723,204 | 2/1988 | Khera | 364/200 |
| 4,725,987 | 2/1988 | Cates | 365/220 |
| 4,773,044 | 9/1988 | Sfarti et al. | 364/900 |
| 4,800,530 | 1/1989 | Itoh et al. | 365/189 |

Primary Examiner—Jack A. Lane
Attorney, Agent, or Firm—Skjerven, Morrill, MacPherson, Franklin & Friel LLP

[57] ABSTRACT

A digital computer which includes a memory refresh system for controlling the generation and sequencing of refresh signals to a memory subsystem comprised of at least one memory unit having a plurality of slots each capable of receiving a dynamic random access memory bank therein. The memory refresh system includes means for generating refresh signals and at least one independent refresh sequence controller for efficiently controlling the sequence in which the memory banks associated with a particular refresh sequence controller receive refresh signals. Each refresh sequence controller controls a combination of multi-stage shift registers for issuing refresh signals to memory banks installed on the corresponding memory unit and multi-stage shift registers for providing wait cycles during which refresh signals are being generated by other independent refresh sequence controllers. The order of refresh signals generated by each refresh sequence controller varies depending on the configuration of the memory subsystem.

21 Claims, 10 Drawing Sheets

TO FIG. 1B

DIGITAL COMPUTER HAVING A SYSTEM FOR SEQUENTIALLY REFRESHING AN EXPANDABLE DYNAMIC RAM MEMORY CIRCUIT

CROSS REFERENCE TO RELATED APPLICATIONS

This application is a Continuation of application Ser. No. 07/540,049, filed Jun. 19, 1990, now abandoned.

This application is related to the following U.S. patent applications:

| SER. NO. | TITLE | INVENTOR | FILING DATE |
| --- | --- | --- | --- |
| 490,003 | Method and Apparatus for Performing Multi-Master Bus Pipelining | Zeller, et al. | 03/07/90 |
| 529,985 | Processor and Cache Controller Interface Lock Jumper | Holman, et al. | 05/25/90 |
| 540,983 | Error Correction Code Pipeline For Interleaved Memory | Matteson, et al. | 06/19/90 |
| 541,103 | Computer System Having A Selectable Cache Subsystem | Holman | 06/19/90 |
| 540,651 | Address Enabling System And Method For Memory Modules | Durkin, et al. | 06/19/90 |
| 532,046 | Multiple DRAM Assemblies Using a Single PCB | Holman | 05/25/90 |
| 532,045 | Power On Coordination System And Method For Multiple Processors | Holman, Lunsford | 05/25/90 |
| 530,137 | Dual Path Memory Retrieval System for an Interleaved Dynamic RAM Memory Unit | Gaskins, et al. | 05/25/90 |
| 516,628 | Digital Computer Having an Error Correction Code (ECC) System with Comparator Integrated Into Re-Encoder | Longwell, et al. | 04/30/90 |
| 516,606 | Shared Logic For Error Correction Syndrome Encoding | Longwell, et al. | 04/30/90 |

All of the foregoing applications are assigned to the assignee of the present invention and are hereby incorporated by reference.

BACKGROUND OF THE INVENTION

1. Field of the Invention

The invention relates to computer memory systems and, more particularly, to the refresh of DRAM storage elements in such memories.

2. History of the Prior Art

Data processing systems for computers use memory to store information. More specifically, the data processor of a computer stores individual units of information consisting of a specific number of bits representing binary digits at specific locations within a memory unit. The locations within the memory where data bits are stored, are specified by addresses. Each address consists of a specific number of bits and the total number of bits available for address information defines the total number of memory locations that can be addressed within the computer. The total number of addressable memory locations, in turn, provides a limit to the amount of information that can be stored and accessed by the data processor. This limitation in memory limits the capability of the data processor in performing its data processing functions.

Depending on their access characteristics, computer memory units may be categorized in either of two types of memory configurations. One type of memory unit is referred to as the read only memory (or "ROM") type of memory. In general, ROMs are characterized by the permanent storage of memory at selected locations. A random access memory (or "RAM"), on the other hand, is generally characterized by the ability to both write information into and read information out of the memory at any location and in any desired sequence.

A typical RAM consists of a plurality of memory cells, an address decoder, read/write control circuitry and a memory output register. While there are many variations in the structure of and interconnection between the basic elements of RAMs which are utilized to separate different RAM designs into numerous classifications, RAMs may be separated into two distinct types based on the structure of the memory cells used in the memory unit—the "static" RAM (or "SRAM") and the "dynamic" RAM (or "DRAM"). In the SRAM, each memory cell consists of a flip-flop circuit comprised of 4–6 transistors or other semiconductor devices and each memory cell has, therefore, two stable states. As long as power is supplied to the memory cells, the information stored in the cells will be maintained.

In contrast, each memory cell of a DRAM includes a microscopic "storage" capacitor consisting of two conductive layers separated by an insulator. The memory cell of a DRAM stores a single bit of information in the microscopic capacitor as the presence or absence of an electric charge in that capacitor. A charged capacitor generally represents a "1" and a discharged capacitor generally represents a "0". Usually, a single transistor is used to control charging the storage capacitor.

Since the electric charge stored in the storage capacitor of a memory cell will gradually leak away, the stored information must be periodically rewritten into the cell before the charge completely leaks out. This periodic rewriting of the information previously stored in the memory cell is called "refreshing" the memory. The frequency at which a memory cell must be refreshed varies depending on the rate of leakage in the control transistor. In a typical DRAM, each memory cell must be refreshed every two, four or eight milliseconds.

Although the refreshing operation requires additional circuitry to coordinate the procedure, the DRAM is often used due to certain advantages over the SRAM. For example, because the DRAM requires only a single control transistor while the SRAM requires 4 to 6 transistors, the DRAM occupies a much smaller area on the silicon substrate than the SRAM and is less expensive to manufacture. Furthermore, the DRAM consumes less power than a SRAM. Thus, DRAMS are particularly attractive in most microcomputer systems where space and power consumption are at a premium.

In a memory unit which is comprised of DRAMs, both memory access (i.e. writing to or reading from a memory cell) and refresh operations are controlled by a combination of a pair of signals called a row address strobe (or "RAS") signal and a column address strobe (or "CAS") signal, respectively. During a memory access operation, the RAS and CAS signals are used to select the particular memory cell to be accessed. Some DRAMs also require manipulation of both the RAS and CAS signals to perform a refresh cycle. Other DRAMs may be refreshed by activating only the RAS signal.

During a refresh operation which requires both the RAS and the CAS signals to refresh the memory unit having DRAMs, information is read out of any number of memory cells and then rewritten back into the cells where the information will remain for the maximum time limit between refresh cycles. Typically, the circuitry corresponding to such conventional refresh operations is arranged so that a refresh cycle occurs after each memory access such that an entire row of memory cells will be refreshed at the same time. As a result, accessing any cell in a particular row causes the entire row to be refreshed. Other memory units which include DRAMs require only a RAS signal to perform a refresh operation. In these devices, when a row address is presented to the DRAM, the RAS signal goes active, thereby refreshing all locations which have the same row address. To completely refresh this type of DRAM memory unit, therefore, it is required to sequentially cycle through all of the row addresses within the maximum time limit.

When a computer system is provided with large amounts of memory, the need to constantly refresh DRAMs can create numerous problems. For example, many memory units now include four megabit DRAMs having 1024K row addresses. The computer system which is the subject of the present application, employs a memory unit which may include up to eight double-sided, single in-line memory modules (or "SIMMs") where each side of a SIMM will store 32 bits of a 64 bit data word at the 1024K address locations of a 4 Megabit DRAM. Still other configurations of the memory unit which include even larger amounts of memory are also contemplated. Because of the large size of the memory unit provided in the computer system which incorporates the present invention therein, any attempt to simultaneously refresh all of the DRAM SIMMS would require a substantial amount of power to simultaneously provide a RAS signal to every row of every memory bank in the memory unit. Since there is a plurality of memory banks, the refresh power requirement for refreshing all memory banks simultaneously would generate a large power surge, resulting in possible electromagnetic interference problems, as well as require an excessive amount of power service.

For these reasons, large memory systems which utilize DRAMs have traditionally included associated circuitry which staggers the refresh signals to the different banks in the memory system. In such a configuration, the staggered refresh circuit would generate a row address to all of the memory banks and generate a RAS pulse to instruct the DRAMs to latch the row address to each of the banks in turn.

Various staggered memory refresh systems for DRAMs are known. For example, U.S. Pat. No. 4,601,018 to Baum et al. discloses a refresh system where a series of memory banks are refreshed at different times. In Baum et al., the memory refresh circuit is connected to a display circuit whereby outputs of the display circuit determine when memory refresh is required and which banks of memory are to be refreshed. The inputs to the memory refresh timing circuitry determine the appropriate time intervals to refresh selected memory banks. While Baum et al. provides for timing requirement modification, Baum et al. does not provide any circuitry for altering the sequence of refresh timing based on the memory configuration.

Such prior systems do not provide sufficient flexibility to maximize the efficiency of the memory refresh sequence for the memory unit. Depending on the particular configuration of a computer system, any number of memory slots included in a memory unit may have a memory bank installed therein. For example, a system incorporates a memory unit having eight slots which are each capable of having a memory bank installed therein, and if only four of the slots actually have memory banks installed, a refresh cycle which sequentially issues a memory refresh signal to each slot would be inefficient. It would be preferable that the memory refresh sequence would issue refresh signals only to those slots in which memory banks had been installed. Not only would such a capability improve the efficiency of the refresh sequence, it would improve access to the memory unit as well.

In addition, many memory refresh systems do not permit data to be written to or read from the memory during refresh operations. Such restrictions in prior systems result in an unnecessarily long refresh sequence which seriously restricts the bandwidth within which the processor can access the memory unit. Thus, the primary purpose of the memory unit, i.e., the rapid storage and retrieval of large amounts of data is degraded.

A flexible memory refresh sequence would also be advantageous when the memory unit of a computer is upgraded or otherwise modified after the initial configuration of the computer system. For example, a memory unit consisting of a single memory card may initially have memory banks installed in only four out of the eight available slots typically provided on a memory card. Increased memory requirements in the computer system may later require that additional memory banks be installed. If the memory refresh sequence is designed based upon the initial memory configuration, changes such as memory upgrades would require resequencing of the refresh signals in order to keep them operating at optimum efficiency. To reduce the time required to modify the refresh sequence, it would be desirable to provide a refresh sequence controller which would maximize the ease with which the refresh sequence can be modified so that efficiency of the refresh sequence is maximized for any particular memory unit configuration.

Finally, when prior art memory units were of sufficient memory capacity that plural refresh sequence controllers were required, the sequence controllers were typically tied directly together. As a result, the installation of an additional memory card or other increase in memory size in a prior art memory would often require an additional sequence controller and necessitate extensive modification to the existing sequence controllers in order to interconnect them. If stand-alone refresh sequence controllers were provided, however, a computer system could be more readily modified to accommodate expansion of the memory unit by requiring only the installation of an additional refresh sequence controller.

SUMMARY OF THE INVENTION

In one aspect, the system of the present invention is a digital computer which includes a computer system having at least one memory unit that may comprise a memory card with a plurality of slots each capable of receiving a dynamic random access memory bank therein and which includes a memory refresh system for controlling the refresh of the memory banks. The memory refresh system includes an independent memory refresh sequence controller for each memory card included in the memory unit and means for sequentially refreshing the memory banks by the generation of refresh signals. Each memory refresh sequence controller selectively controls the order in which the memory banks installed on the corresponding memory card are refreshed such that the refresh sequence for the memory unit is operated efficiently.

In a further aspect of the invention, each memory refresh sequence controller controls at least one multi-stage shift register for issuing refresh signals to memory banks installed on the corresponding memory card and at least one multi-stage shift register for providing wait cycles during which refresh signals are being generated by other memory refresh circuits included in the memory refresh system. Each memory refresh controller includes a series of inputs which vary depending on the configuration of the memory unit installed in the particular computer system so that the refresh sequence of each independent memory refresh controller varies depending on the configuration of the installed memory unit.

In yet another aspect of the invention, the present invention is a digital computer which includes a system for controlling the refresh operation of a memory unit comprised of at least one memory card having a series of dynamic RAM memory banks installed therein. The system includes means for sequentially refreshing the dynamic RAM memory banks and means for selectively controlling the order in which the dynamic RAM memory banks are refreshed. The selective control means adjusts the order in which the memory banks are refreshed based on the number of memory.

DETAILED DESCRIPTION OF THE INVENTION

Figure 1A:
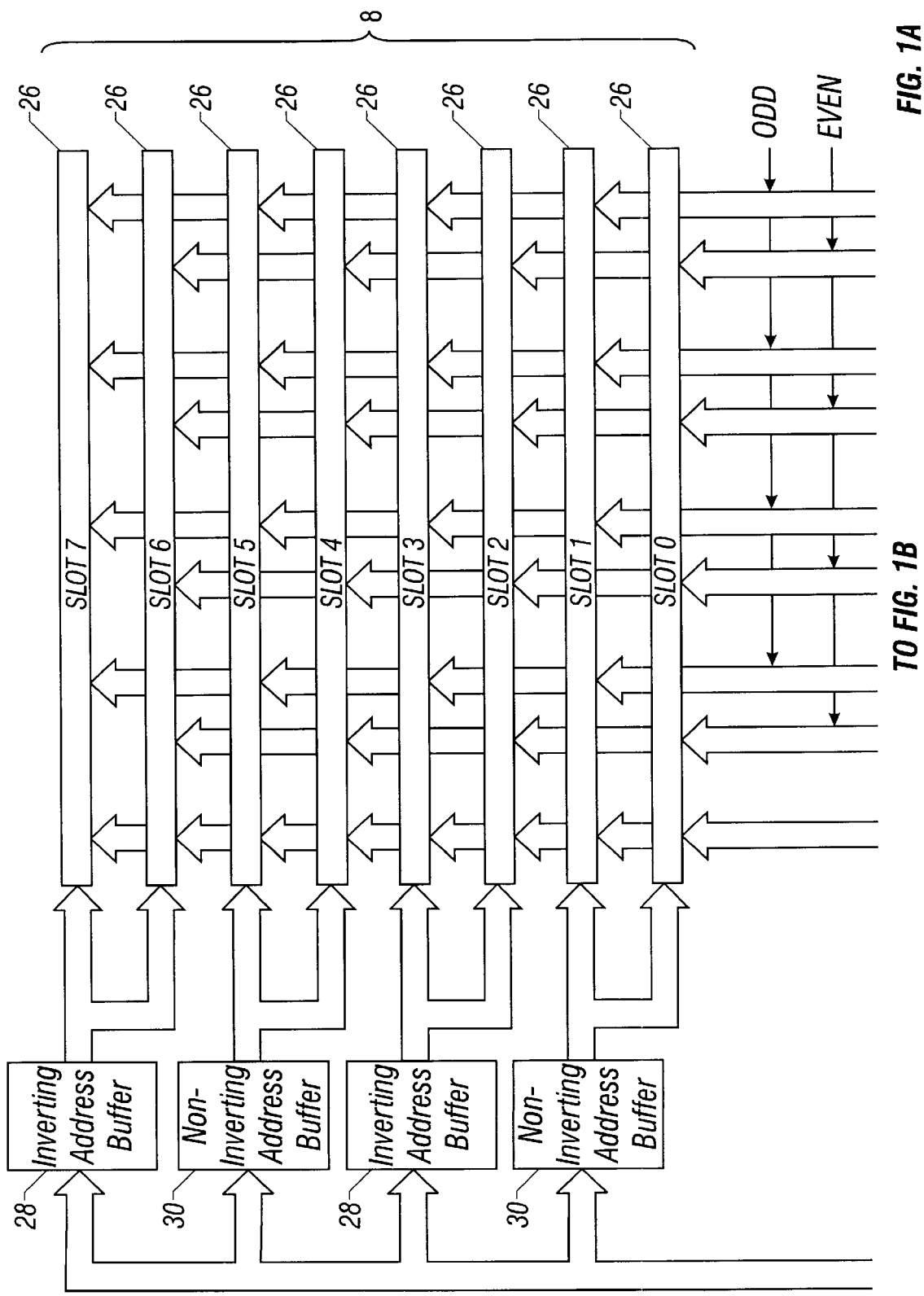
FIG. 1 is a block diagram of a computer system having a DRAM memory refresh system constructed in accordance with the teachings of the present invention.
Figure 1B:
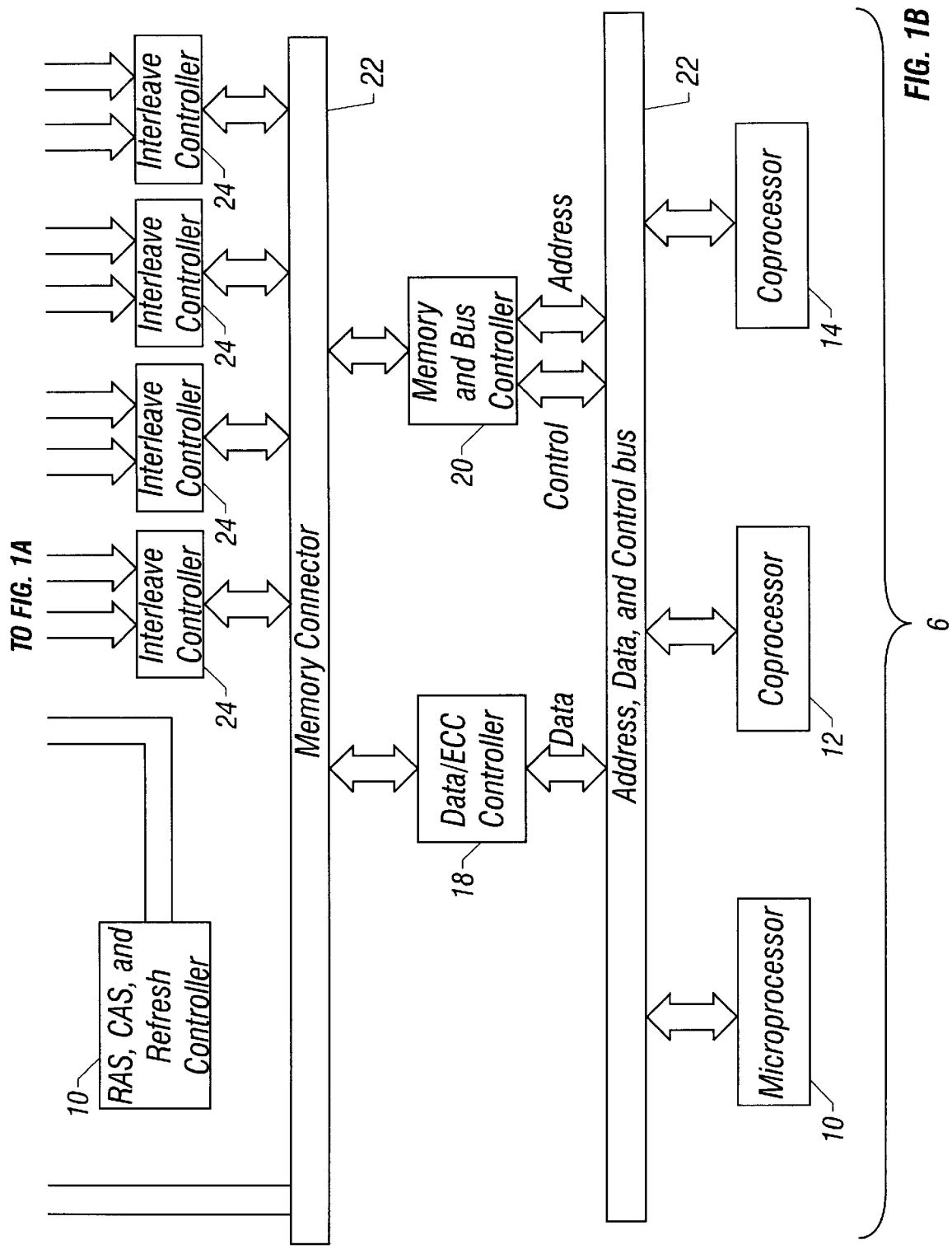

Referring first to FIG. 1, the interconnection between a data processor 6 and a memory unit 8 of a digital computer system will now be described. A data processor for use in a digital computer system may be comprised of any number of interconnected components. For example, it is contemplated that a computer system incorporating the memory refresh module which is the subject of the present invention may include a data processor 6 comprised of a microprocessor 10 such as a Model 80386 microprocessor manufactured by Intel Corporation of Santa Clara, Calif., a first coprocessor 12 such as a Model 80387 coprocessor, also manufactured by Intel Corporation and a second coprocessor 14 such as a Model 3167 coprocessor manufactured by the Weitek Company. The microprocessor 10, first coprocessor 12 and second coprocessor 14 are interconnected with each other via an address, data and control bus 16 of conventional design.

The flow of data between data processor 6 and memory unit 8, which is to be more fully described below, is controlled by data flow and error correction code (or "Data/ECC") controller 18. Control and address signals from the data processor 6 to the memory unit 8 are transmitted by a memory and bus (or "memory/bus") controller 20. The data/ECC controller 18 and the memory/bus controller 20 transmit and receive memory data, memory address signals and memory control signals to and from the memory unit 8 via the memory connector 22.

From the memory connector 22, data is written to and read from the memory unit 8, via a series of interleave controllers 24a–24d. Briefly, the memory unit 8 is comprised of at least one memory card having a series of slots provided thereon for receiving memory banks 26a–26h comprised of DRAM memory components. Data is stored in 64 bit blocks, but because the processor and ECC circuitry only handle 32 bit double words, interleaving is used to handle the entry and retrieval of each pair of 32 bit double words comprising a 64 bit block (actually each 32 bit data word comprises 39 bits, since with ECC each word also includes 7 syndrome bits, so that a total 78 bit block is formed) in the form of 2 interleaved banks of 32 bit double words, one odd and one even. Each interleave controller 24a–24d multiplexes eight bits of data (exclusive of parity or ECC syndrome bits) between the memory connector 22 and the memory banks 26a–26h. In other words, for a read command, each interleave controllers 24a–24d access eight even data bits from an even memory bank and eight odd data bits from an odd memory bank.

Also provided between the memory connector 22 and the memory banks 26a–26h are inverting address buffers 28 and non-inverting address buffers 30 for minimizing electrical noise. A RAS, CAS and refresh controller 32 (which includes the memory refresh modules 34a and 34b) receives encoded control signals from the memory connector 22 and, in turn, transmits decoded control signals, i.e. the previously discussed RAS and CAS signals, to the memory banks 26a–26h as they are needed to access a data location. In addition, the RAS, CAS and refresh controller 32 also generates refresh signals to the memory banks 26a–26h as is more fully discussed below.

Figure 2:
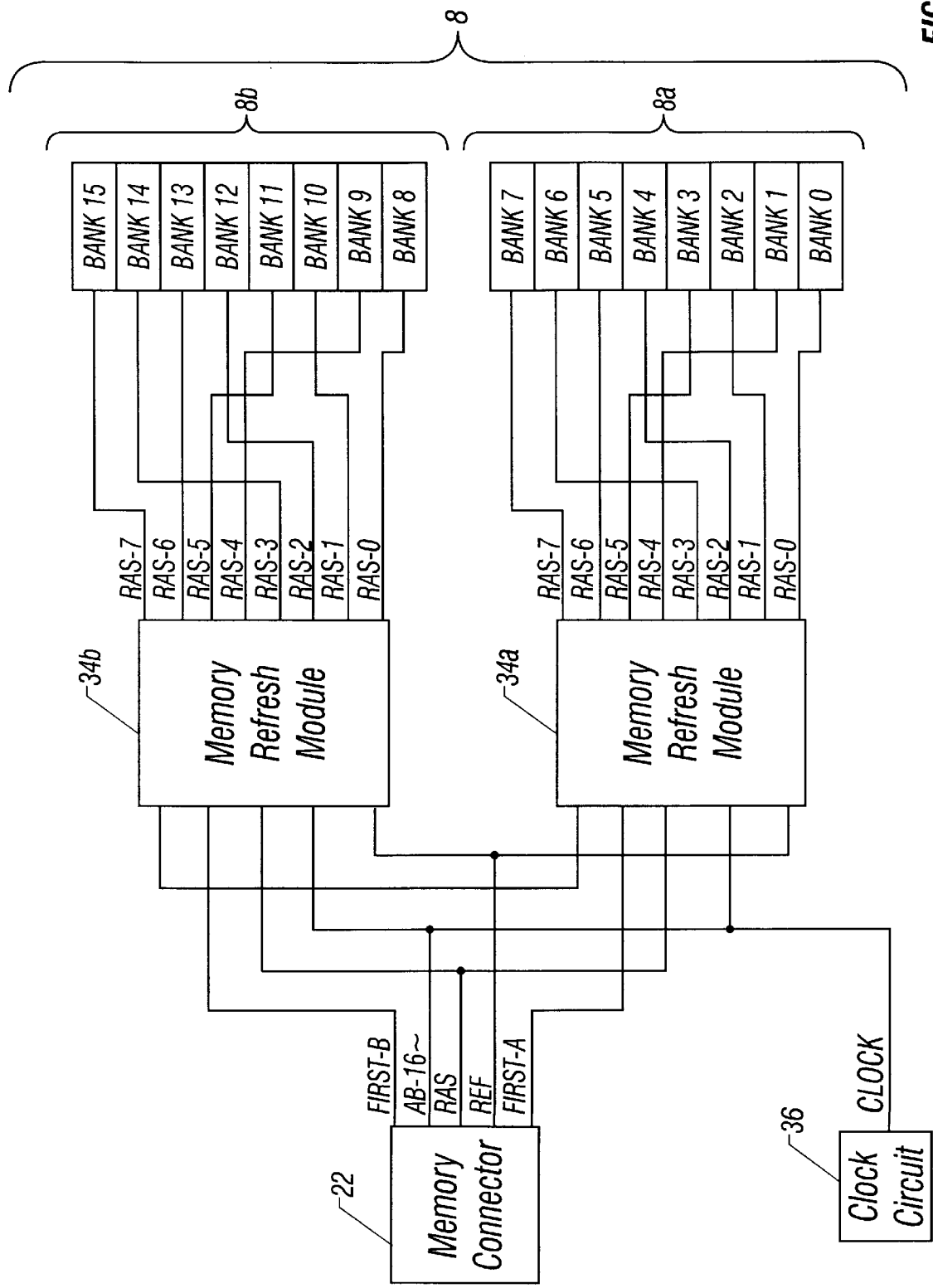
FIG. 2 is a schematic diagram illustrating the interconnection of the memory refresh system and a memory unit comprised of a pair of memory cards.

Referring next to FIG. 2, the interconnection between the memory refresh modules 34a, 34b and the memory unit 8, which provides for the refresh of the dynamic components of the memory unit 8 is now described in greater detail. In the embodiment illustrated in FIG. 2, the memory unit 8 is comprised of a pair of memory cards 8a and 8b, respectively. Each memory card 8a, 8b has a series of eight slots, into each of which a memory bank has been installed therein. Accordingly, the memory unit 8 includes a series of sixteen memory banks herein identified as memory banks 0–15 evenly divided between the memory cards 8a, 8b. Preferably, each memory bank 0–15 is comprised of one side of a double-sided SIMM. It is contemplated, however, that in alternate embodiments of the invention, the memory unit 8 may be comprised of one, two or more memory cards and further that the memory banks 26a–26h installed on said memory cards may be comprised of single-sided SIMMs, double-sided SIMMs or any combination thereof. It is further contemplated that the memory refresh sequence generated by the memory refresh modules 34a and 34b included as part of the RAS, CAS and refresh controller 32 may be easily modified such that numerous combinations of the number of memory cards and/or combinations of single and/or double sided SIMMs may be installed in the memory unit 8 without detrimentally affecting the efficiency of the memory refresh sequence. Finally, while FIG. 1 illustrates a single RAS, CAS and refresh controller 32 which includes a single memory refresh means for refreshing a memory unit comprised of a single memory card, a memory unit comprised of a pair of memory cards may be refreshed by the installation of a second RAS, CAS and refresh controller 32 which includes a second memory refresh means.

Each memory refresh module 34a, 34b of a single memory refresh means has five inputs: RAS, CLOCK, REF, $A8_{13}$ 16~ and FIRST which, as described below, will generate a series of refresh signals RAS 0–7 to each series of memory banks associated therewith. A RAS signal is generated by the memory/bus controller 20 by conventional means and is transmitted to the corresponding memory refresh modules 34a or 34b via the memory connector 22 and the RAS input. The RAS signal is asserted at the beginning of the refresh sequence and stays high a sufficient time to refresh a DRAM. Accordingly, the width of the RAS input pulse will vary depending on the physical characteristics of the DRAMs installed in the memory banks. Each memory refresh module 34a, 34b also receives a clocking signal generated by a clock circuit 36. The clock circuit 36 generates a series of pulses separated by a time period sufficient to permit, as is more fully described below, a shift register to advance. A refresh (or "REF") signal is also generated by the memory/bus controller 20 by conventional means and is transmitted to the corresponding memory refresh modules 34a or 34b via the memory connector 22 and the REF input. The REF signal brings the memory refresh module 34a, 34b out of reset, thereby permitting the refresh sequence to commence. Accordingly, the period of the REF signal is selected to be the same as the period of time after which the DRAMs installed in the memory banks 8a, 8b require refreshing. For example, typical DRAMs contemplated for being installed in the memory banks 8a, 8b would require refresh 256 to 1024 times every refresh period. The final two inputs to each memory refresh module 34a, 34b are the A8__16~ and FIRST input signals FIRST-A and FIRST-B which are selectively tied to a high or low voltage. These inputs vary depending upon the configuration of the memory unit 8 installed. Depending on the states of the A8__16~ and the corresponding FIRST input FIRST-A or FIRST-B, the sequence in which the memory banks associated with the memory refresh module 34a, 34b will vary. As a result, the memory refresh module 34a, 34b will modify the memory refresh sequence depending on the particular configuration of the number of memory cards included in the memory unit 8 as well as the number of memory banks installed in each memory card 8a, 8b.

The A 8__16~ input to the memory refresh module 34a, 34b indicates whether the memory unit 8 includes one or two memory cards. A "1" input on the A8__16~ input indicates that the memory unit 8 is comprised of a single memory card 8a or 8b and a "0" on the A8__16~ input indicates that the memory unit 8 includes both the memory card 8a and the memory card 8b. Separate FIRST inputs FIRST-A and FIRST-B are provided to the memory refresh module 34a, 34b, respectively, to indicate to the respective memory refresh module 34a, 34b whether that refresh controller is controlling refresh in the "low" memory banks (hereby designated as memory banks 0–7) corresponding to the memory card 8a or the "high" memory banks (hereby designated as memory banks 8–15) corresponding to the memory card 8b.

Each memory refresh module 34a, 34b has a series of 8 outputs designated as outputs RAS 0–7 which control the sequential refresh of the memory banks tied to the respective memory refresh module 34a, 34b. The order in which the RAS signals are generated and the order in which the memory banks 0–15 are refreshed depends on the states of the A8__16~, FIRST-A and FIRST-B signals. When a single memory refresh module 34a, 34b and a single memory card 8a, 8b are installed, the refresh pulse generation and the bank refresh sequence proceed as follows.

| A8__16 | FIRST-A or FIRST-B | ORDER OR RAS SIGNAL GENERATION |
|---|---|---|
| 1 | 0 | 0 1 2 3 4 5 6 7 |
| 1 | 1 | 0 1 2 3 4 5 6 7 |

| A8__16 | FIRST-A or FIRST B | ORDER OF BANK REFRESH |
|---|---|---|
| 1 | 0 | 0 1 2 3 4 5 6 7 |
| 1 | 1 | 8 9 10 11 12 13 14 15 |

When plural memory refresh module and memory cards are installed, the refresh pulse generation and bank refresh sequence change dramatically.

| A8__16 | FST-A | FST-B | ORDER OF RAS SIGNAL GENERATION |
|---|---|---|---|
| 0 | 1 | — | 0 1 2 3 w w w w 4 5 6 7 w w w w |
| 0 | — | 0 | w w w w 0 1 2 3 w w w w 4 5 6 7 |

| A8__16 | FST-A | FST-B | ORDER OF BANK REFRESH |
|---|---|---|---|
| 0 | 1 | — | 0 1 2 3 w w w w 4 5 6 7 w w w w |
| 0 | — | 0 | w w w w 8 9 10 11 w w w w 12 13 14 15 | w = wait cycle

In this sequence, all 16 banks will be refreshed sequentially with no two banks receiving the beginning of the refresh pulse at once. The unique configuration of each memory refresh module is such that when A8__16~ is high, i.e. the memory unit 8 includes only one memory card, the eight RAS outputs of the memory refresh module are generated sequentially, thereby refreshing the corresponding memory banks sequentially. When A8__16~ goes low, i.e. the memory unit 8 includes a pair of memory cards, the RAS outputs of the memory refresh module 34a, 34b change dramatically. When A8__16~ is low, wait cycles during which no outputs are produced will be interspersed between certain RAS outputs of the memory refresh module depending on whether the memory refresh module is refreshing the lower or upper memory banks, thereby changing the sequence that the memory banks are refreshed.

When the pair of memory refresh module 34a, 34b are utilized to refresh a dual memory card system such as the pair of memory cards 8a and 8b, all of the banks 0–15 are refreshed with no overlap as the memory refresh modules 34a and 34b follow different refresh sequences. As a result of the configuration of the memory refresh module 34a, 34b, different refresh sequences may be selected while maintaining maximum efficiency in refreshing each particular system. Each memory refresh module 34a, 34b utilizes the A8__16~ and FIRST signals to determine which section of the memory the refresh controller 32 is responsible for. As a result, identical memory refresh modules 34a, 34b may be utilized for both the low and high memory cards without requiring any interconnections between the two.

It is a unique feature of the invention that the bank refresh order and assignment of bank numbers are selected so that no penalty is paid for using single sided SIMMs. By adjusting the width of the REF signal into the memory refresh module 34a, 34b, the memory refresh module 34a, 34b sequentially refresh only those memory banks actually installed. For example, if the memory unit 8 includes single-sided SIMMs installed in the banks 0, 1, 2, 3 of the memory card 8a and the bank 8 of the memory card 8b, shortening the length of the REF pulse to 5 CLOCK cycles will refresh only those memory banks. In a second example, the memory banks 0, 1, 2, 3 and 8, 9, 10, 11 are installed whether single-sided or double-sided SIMMs are utilized. The memory banks 4, 5, 6, 7 and 12, 13, 14, 15, on the other hand, are installed only when double-sided SIMMs are utilized. Accordingly, when double-sided SIMMs are installed, the memory refresh module will first sequentially refresh all of the first sides of the SIMMs and then sequentially refresh all of the second sides of the SIMMs. On the other hand, when single-sided SIMMs are installed and the refresh pulse width is shortened by one-half, the memory refresh module generates a refresh sequence comprising only the sequential refresh of all of those memory banks corresponding to the first sides of the SIMMs.

Figure 3:
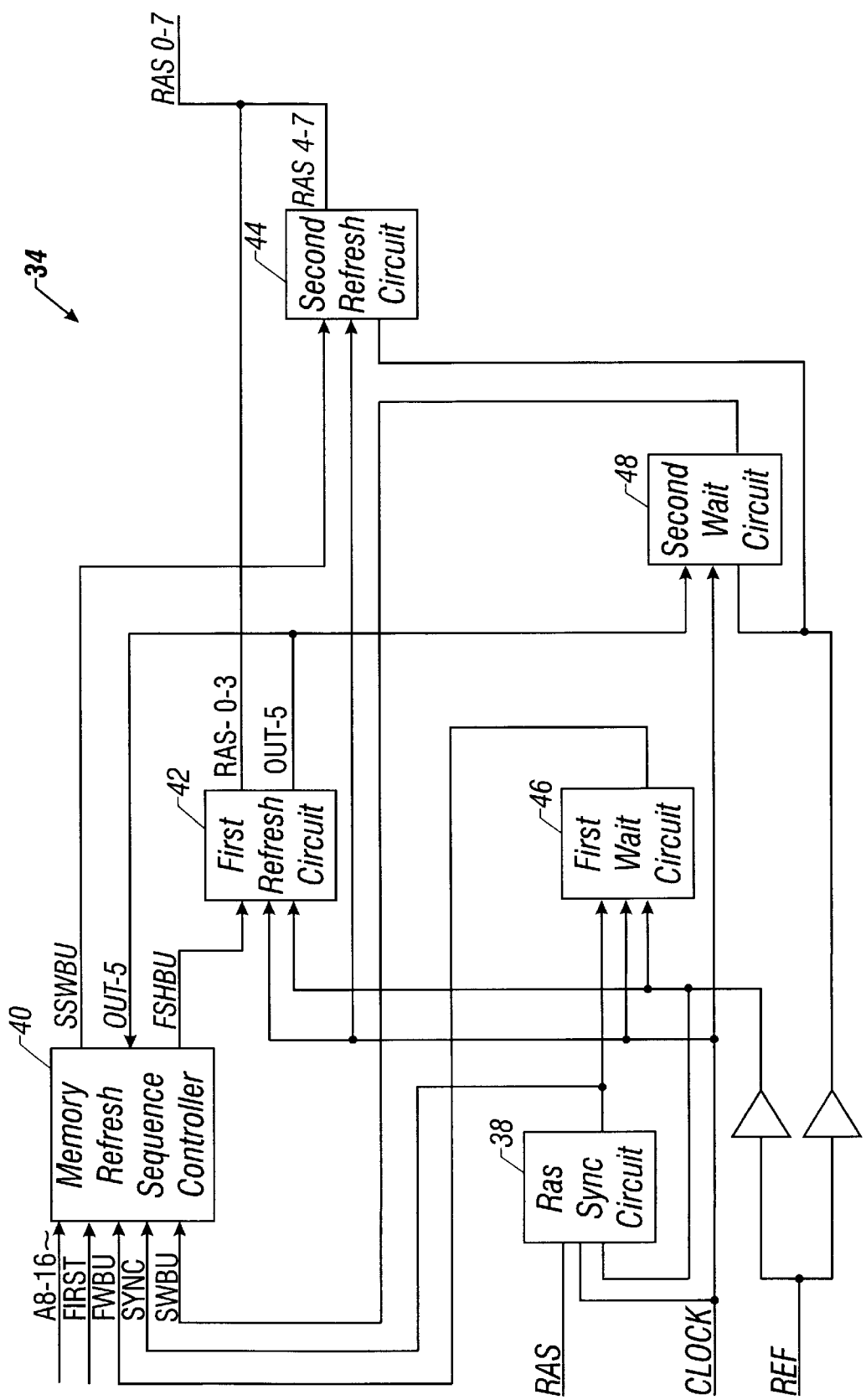
FIG. 3 is a schematic diagram of the memory refresh module of the memory refresh system of FIG. 2.

Referring next to FIG. 3, the memory refresh module 34a, 34b will now be described in greater detail. Each memory refresh module 34a, 34b includes a RAS synchronizing circuit 38 for synchronizing the RAS signals and the clock pulses; a memory refresh sequence controller 40; a first refresh circuit 42 which transmits refresh signals RAS 0–3 to the memory banks tied to those signals; a second refresh circuit 44 which transmits refresh signals RAS 4–7 to those memory banks tied thereto; and first and second wait circuits 46, 48 for inserting a series of wait cycles where the memory refresh module does not generate a refresh signal to a memory bank. As will be more fully described below, wait cycles are generated by systems having plural memory refresh modules for refreshing a memory unit having plural memory cards such that no two memory refresh modules will be refreshing memory banks simultaneously.

As previously stated, the memory cards 8a, 8b require periodic refresh. Refreshing of the memory cards 8a, 8b commences upon the generation of the REF signal by the memory refresh modules 34a, 34b. The refresh signal is a pulse of length equal to the time required to refresh a DRAM installed in a memory bank multiplied by the total number of slots 26a–26h which have been filled by memory banks. The REF signal remains high during the entire refreshing sequence and goes low between refresh cycles.

Also at the beginning of the refresh sequence, the RAS signal, which is a pulse of length equal to the time required to refresh a memory bank, is generated by the memory refresh module 34. The RAS signal is input to the RAS synchronizing circuit 38 along with a periodic clock pulse (CLOCK) generated by the clock circuit 36 of conventional design. The RAS synchronizing circuit 38 synchronizes the RAS signal with a clock pulse and outputs a synchronized RAS signal ("SYNC") to the memory refresh sequence controller 40 and the first wait circuit 46. In turn, the first wait circuit 46 outputs a pulse ("FWBU") to the memory refresh sequence controller 40 after a period of time equal to the length of four RAS pulses have elapsed.

If the A8_16~ signal is high or if both the A8_16~ and the FIRST signals are low, the FWBU pulse doesn't matter to the memory refresh sequence controller 40 and, upon receipt of the SYNC pulse, the memory refresh sequence controller 40 generates a signal ("FSHBU") to the first refresh circuit 42 to begin generating RAS pulses to the memory card. If, however the A8_16~ signal is low and the FIRST signal is high, the memory refresh sequence controller 40 will not generate the FSHBU signal until receiving the FWBU pulse from the first wait circuit 46.

The first refresh circuit 42 generates five sequential pulses of a width equal to a RAS pulse. The first four pulses ("RAS 0–3") are transmitted to the memory card for sequentially refreshing three memory banks. The fifth pulse ("OUT-5") is transmitted to the memory refresh sequence controller 40 and the second wait circuit 48. Like the first wait circuit 46, the second wait circuit 48 outputs a pulse ("SWBU") to the memory refresh sequence controller 40 after a period of time equal to the length of four RAS pulses have elapsed. If the A8_16~ signal is high, the SWBU pulse doesn't matter to the memory refresh sequence controller 40 and, upon receipt of the OUT-5 pulse, the memory refresh sequence controller 40 will generate a SSHBU signal to the second refresh circuit 44 to begin generating additional RAS pulses to the memory card. If the A8_16~ signal is low, however, the FIRST signal doesn't matter and the memory refresh sequence controller 40 will not generate the SSHBU signal until receiving the SWBU pulse from the second wait circuit 48.

The second refresh circuit 44 generates five sequential pulses of a width equal to a RAS pulse. The first four pulses ("RAS 4–7") are transmitted to the memory card for sequentially refreshing four memory banks. The fifth pulse is left unconnected. After RAS-7 has been transmitted to the memory card, all banks on that memory card have been refreshed and the memory refresh modules 34a, 34b will not generate any additional refresh pulses until the REF signal resets the refresh circuits 42, 44 and the wait circuits 46, 48 by going low, and then going high to indicate the beginning of the next refresh cycle.

Figure 4:
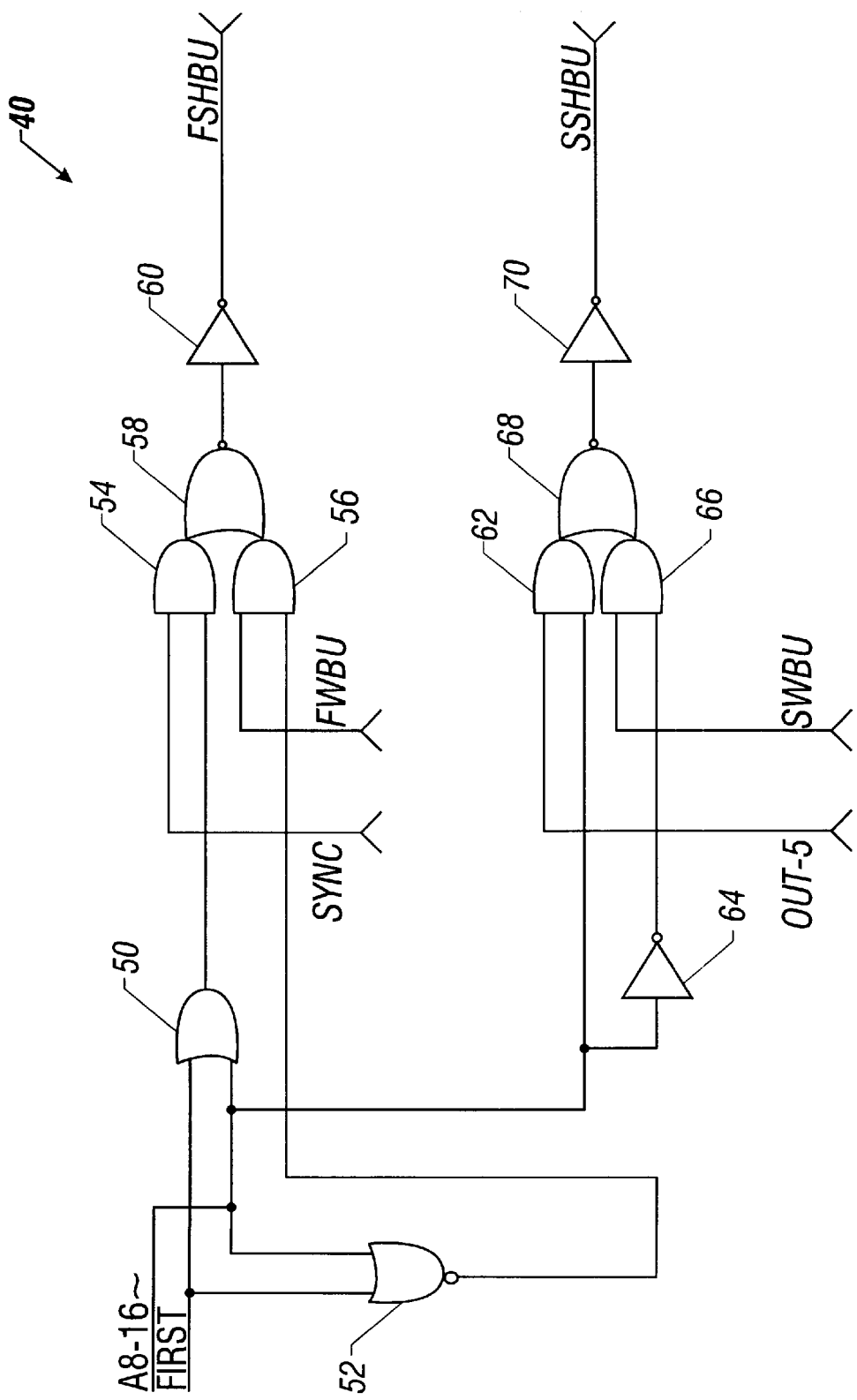
FIG. 4 is a schematic diagram of the memory refresh sequence controller of the refresh signal generating means of FIG. 3.

Referring next to FIG. 4, the memory refresh sequence controller 40 will now be described in greater detail. The memory refresh sequence controller 40 is comprised of a series of logic gates of conventional design interconnected as herein described. Both the A8_16~ and FIRST signals are each input into an OR gate 50 and a NOR gate 52. The output of the OR gate 50 is, in turn, provided as a first input to an AND gate 54 and the SYNC output from the RAS synchronizing circuit 38 is provided as a second input to the AND gate 54. The output of the NOR gate 52, on the other hand, is provided as a first input to an AND gate 56 and the FWBU output from the first wait circuit 46 is provided as a second input to the AND gate 56. The outputs of the AND gates 54, 56 are input to a NOR gate 58 and the output of the NOR gate 58, after being inverted by an invertor 60, is the FSHBU signal to be supplied to the first refresh circuit 42 to begin generation of four RAS pulses for refreshing memory banks, either immediately or after four wait cycles, depending on the state of the A8_16~ and FIRST signals. After the four RAS pulses have been generated by the first refresh circuit 42, the first refresh circuit 42 provides the OUT-5 signal as a first input to an AND gate 62 and the A8_16~ signal is provided as a second input to the AND gate 62. The A8_16— input, after being inverted by an invertor 64 is provided as a first input to an AND gate 66 and the SWBU output from the second wait circuit 48 is provided as a second input to the AND gate 66. The outputs of the AND gates 62 and 66 are input into a NOR gate 68 and the output of the NOR gate 68, after being inverted by an invertor 70 is provided as the SSHBU input to the second refresh circuit 44. Here, after the OUT-5 signal has been provided to the AND gate 62, the SSHBU signal will be transmitted to the second refresh circuit 44, thereby beginning the generation of the second set of four RAS pulses for refreshing additional memory banks, either upon receipt of the OUT-5 signal indicating the generation of RAS pulses by the first refresh circuit 42 has been completed, or upon receipt of the SWBU signal indicating that four wait cycles during which a second memory refresh module has generated RAS pulses has been completed, depending on the state of the A8_16~ signal.

Figure 5A:
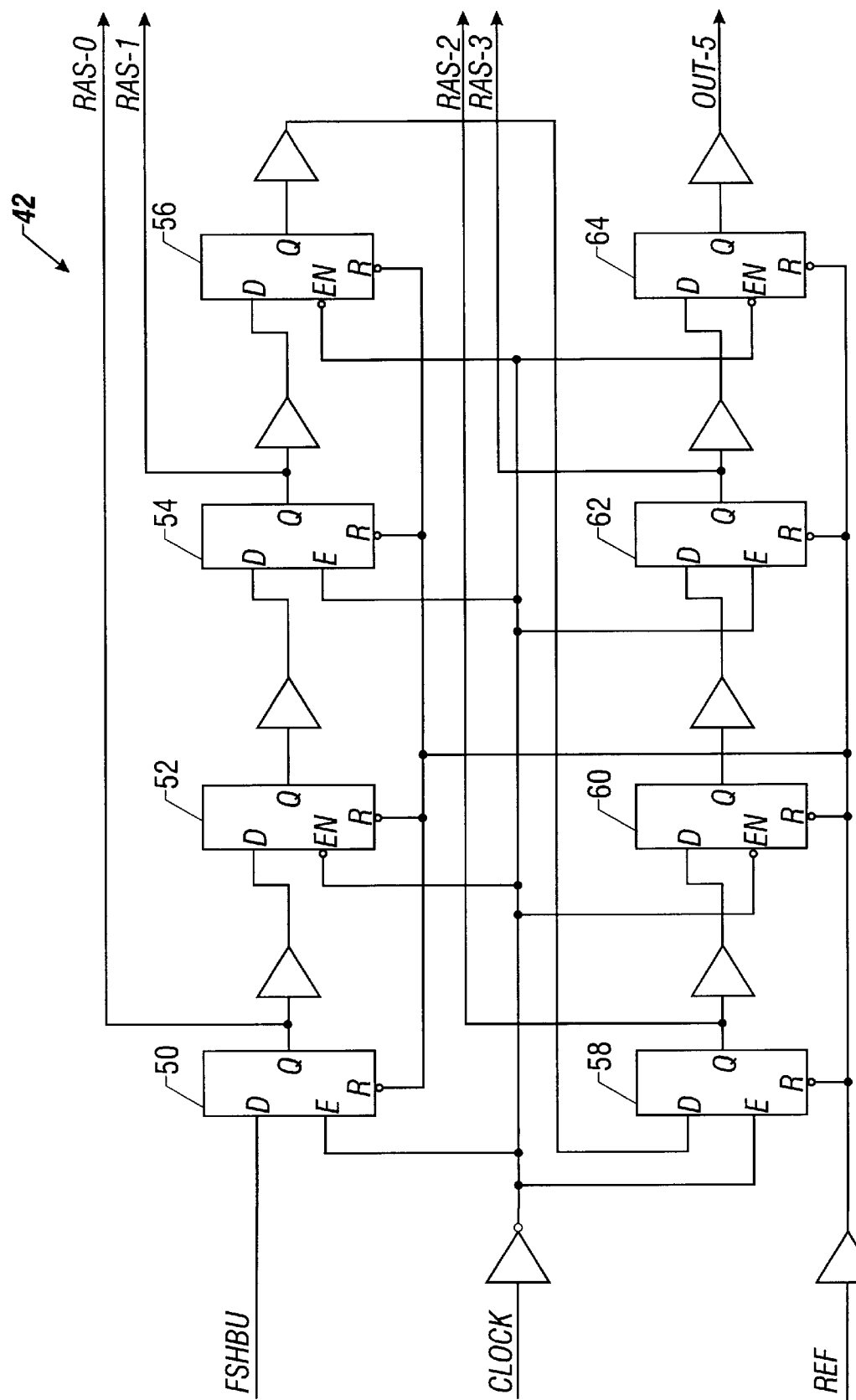
FIG. 5A is a schematic diagram of a first four stage shift register for generating refresh signals RAS 0–3 included as part of the refresh signal generating means of FIG. 3.

Referring next to FIG. 5a, the first refresh circuit 42 will now be described in greater detail. The first refresh circuit 42 is a four-stage shift register comprised of a series of type D latches 50, 52, 54, 56, 58, 60, 62 and 64 tied together in series. The CLOCK signal is tied to a clock ("E" or "EN") terminal of each latch 50–64 and the REF signal is tied to a reset (or "R") terminal of each latch 50–64. The FSHBU output of the memory refresh sequence controller 40 is tied to a D input of the latch 50. When the first refresh circuit 42 is to begin generating refresh signals to the memory card, the FSHBU signal goes high, thereby driving the output of the latch 50 high. As the Q output of each latch 50–62 is tied to a D input of each successive latch 52–64, the high output from the latch 50 is shifted to the outputs of the latches 52–64 in sequence. To provide sequentially generated RAS pulses to the associated memory card, the RAS-0 signal is provided by the output of latch 50, the RAS-1 signal by the output of the latch 54, the RAS-2 signal by the output of the latch 58 and the RAS-3 signal by the output of the latch 62. Finally, the output of the latch 64 is tied to the memory refresh sequence controller 40 to indicate that the first refresh circuit 42 has generated the appropriate RAS pulses.

Figure 5B:
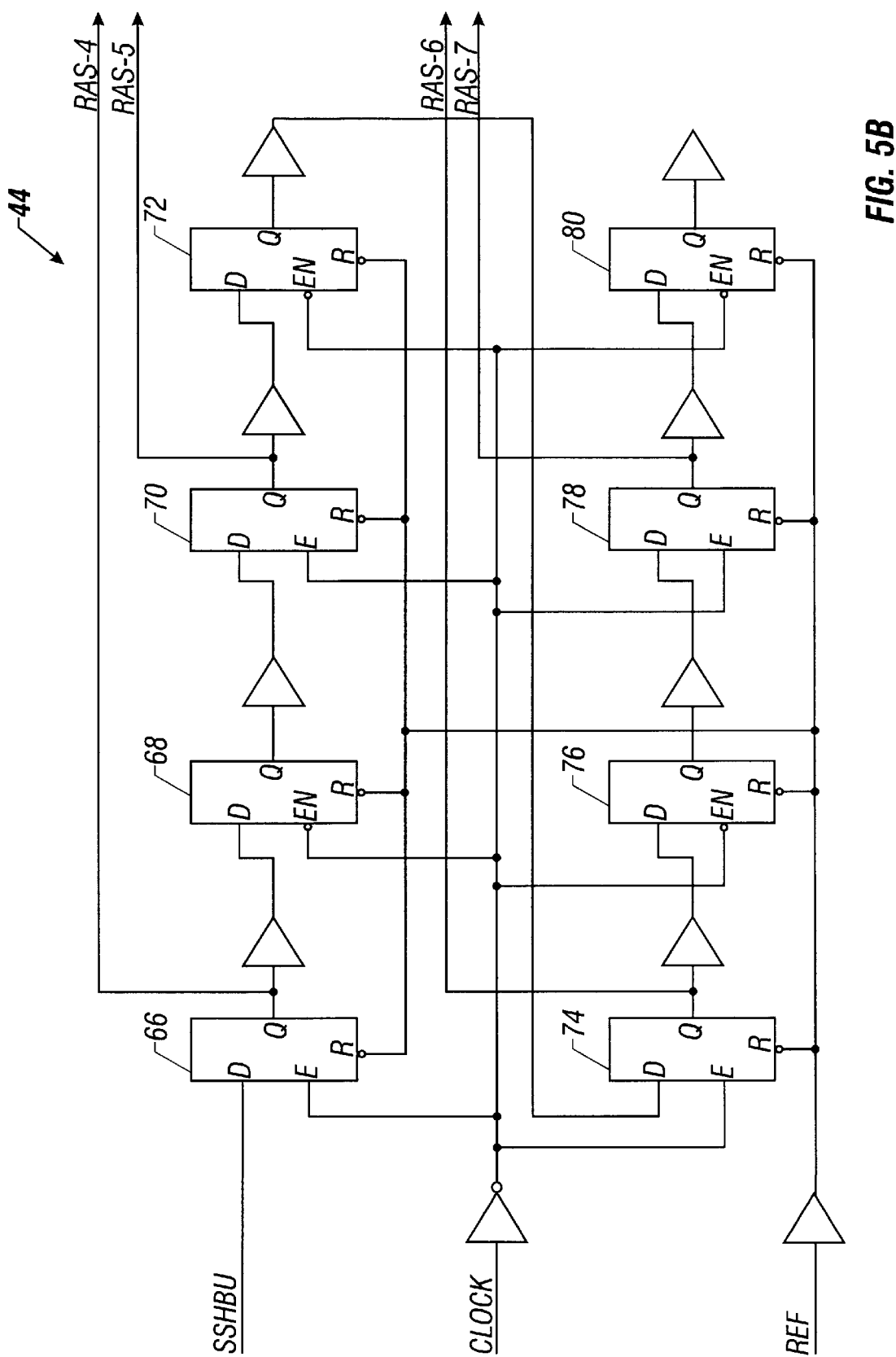
FIG. 5B is a schematic diagram of a second four stage shift register for generating refresh signals RAS 4–7 included as part of the refresh signal generating means of FIG. 3.

Referring next to FIG. 5b, the second refresh circuit 44 will now be described in greater detail. The second refresh circuit 44 is a four-stage shift register comprised of a series of type D latches 66, 68, 70, 72, 74, 76, 78 and 80 tied together in series. The CLOCK signal is tied to a clock ("E" or "EN") terminal of each latch 66–80 and the REF signal is tied to a reset (or "R") terminal of each latch 66–80. The SSHBU output of the memory refresh sequence controller 40 is tied to a D input of the latch 66. When the second refresh circuit 44 is to begin generating refresh signals to the memory card, the SSHBU signal goes high, thereby driving the output of the latch 66 high. As a Q output of each latch 66–78 is tied to a D input of each successive latch 68–80, the high output from the latch 66 is shifted to the outputs of the latches 68–80 in sequence. To provide sequentially generated RAS pulses to the associated memory card, the RAS-4 signal is provided by the Q output of the latch 66, the RAS-5 signal by the Q output of the latch 70, the RAS-6 signal by the Q output of the latch 74 and the RAS-7 signal by the Q output of the latch 78. The Q output of the latch 80 is unconnected.

Figure 6A:
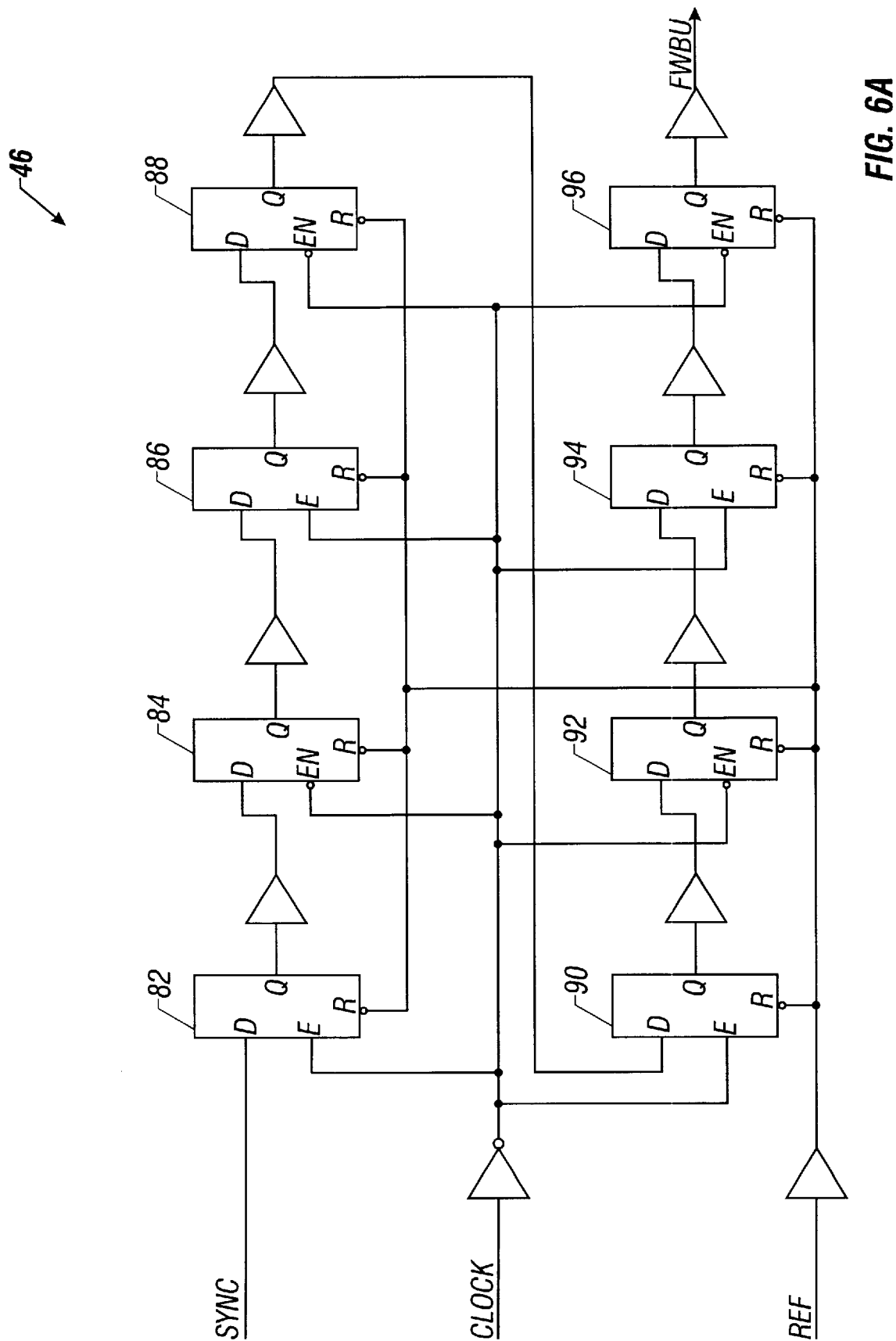
FIG. 6A is a schematic diagram of a first four stary shift register for generating wait cycles included as part of the refresh signal generating means of FIG. 3.

Referring next to FIG. 6a, the first wait circuit 46 will now be described in greater detail. The first wait circuit 46 is a four-stage shift register comprised of a series of type D latches 82, 84, 86, 88, 90, 92, 94 and 96 tied together in series. The CLOCK signal is tied to a clock ("E" or "EN") terminal of each latch 82–96 and the REF signal is tied to a reset (or "R") terminal of each latch 82–96. The SYNC output of the RAS synchronizing circuit 38 is tied to a D input of the latch 82. When the synchronized RAS signal is generated by the RAS synchronizing circuit 38, the first wait circuit 46 begins a first wait cycle. In order to provide a first wait cycle of a duration equal to the time period required to generate four sequential RAS pulses, the first wait circuit 46 is constructed identically to the four stage shift registers which comprise the first and second refresh circuits 42 and 44, respectively, except that only a Q output of the latch 96, which is tied to the memory refresh sequence controller 40 as the FWBU signal, is output from the first wait circuit 46. As previously set forth, whether or not the FWBU signal from the Q output of the first wait circuit 46 must go high before the first refresh circuit 42 will begin generating RAS pulses to the memory card depends on the initial states of the A8_16~ and FIRST signals input to the memory refresh sequence controller 40.

Figure 6B:
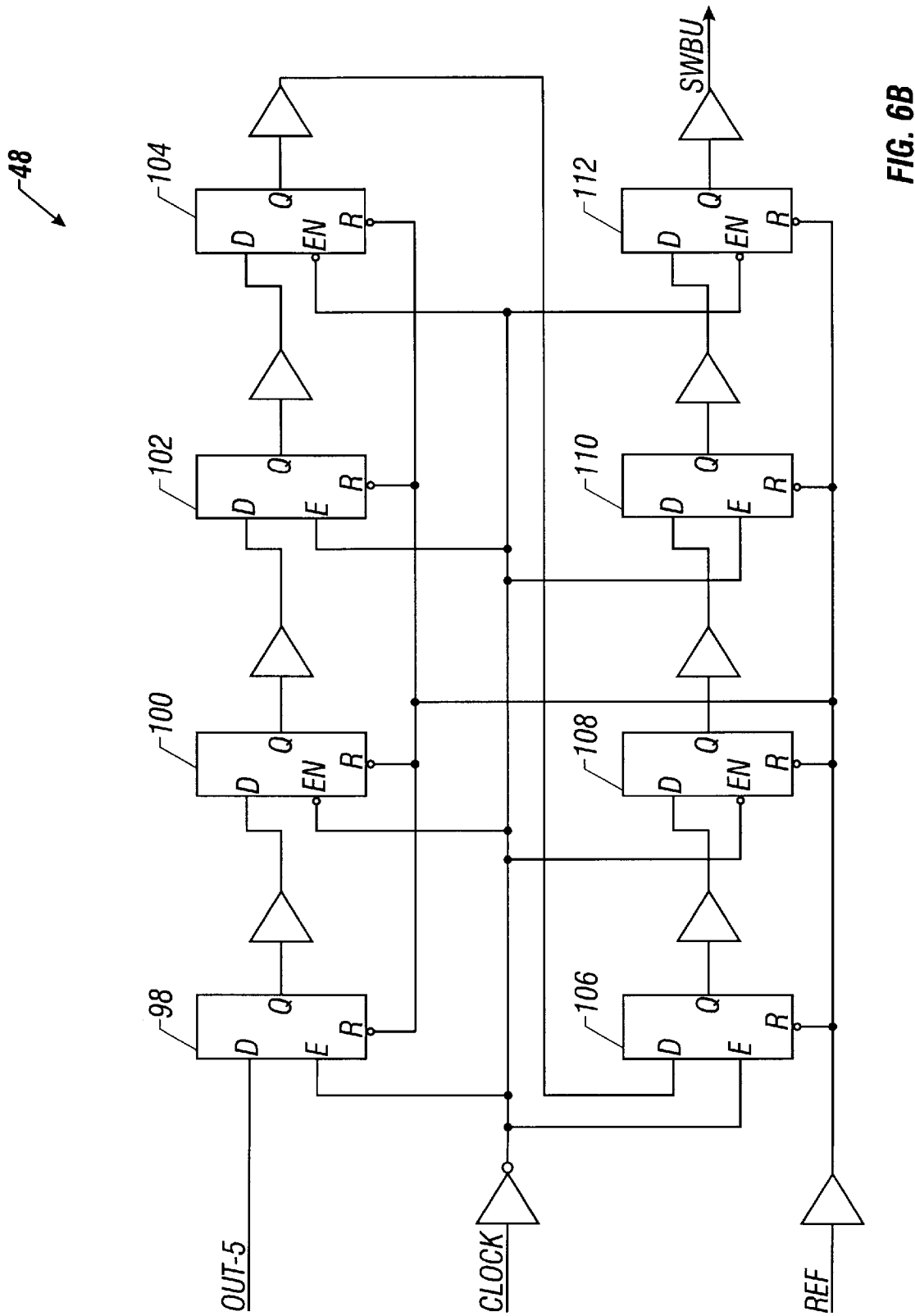
FIG. 6B is a schematic diagram of a second four stage shift register for generating wait cycles included as part of the refresh signal generating means of FIG. 3.

Referring next to FIG. 6b, the second wait circuit 48 will now be described in greater detail. The second wait circuit 48 is a four-stage shift register comprised of a series of type D latches 98, 100, 102, 104, 106, 108, 110 and 112 tied together in series. The CLOCK signal is tied to a clock ("E" or "EN") terminal of each latch 98–112 and the REF signal is tied to a reset (or "R") terminal of each latch 98–112. The OUT-5 signal from the first refresh circuit 42 is tied to a D input of the latch 98. When the OUT- 5 signal indicating that the first four memory banks have been refreshed by the first refresh circuit 42 goes high, the second wait circuit 48 begins a second wait cycle. In order to provide a second wait cycle of a duration equal to the time period required to generate four sequential RAS pulses, the second wait circuit 48 is constructed identically to the four stage shift registers which comprise the first and second refresh circuits 42 and 44, respectively, except that only a Q output of the latch 112, which is tied to the memory refresh sequence controller 40 as the SWBU input, is output from the second wait circuit 48. As previously set forth, whether or not the SWBU signal from the output of the second wait circuit 48 must go high before the second refresh circuit 44 will begin generating RAS pulses to the memory card depends on the initial state of the A8_16~ signal input to the memory refresh sequence controller 40.

Figure 7:
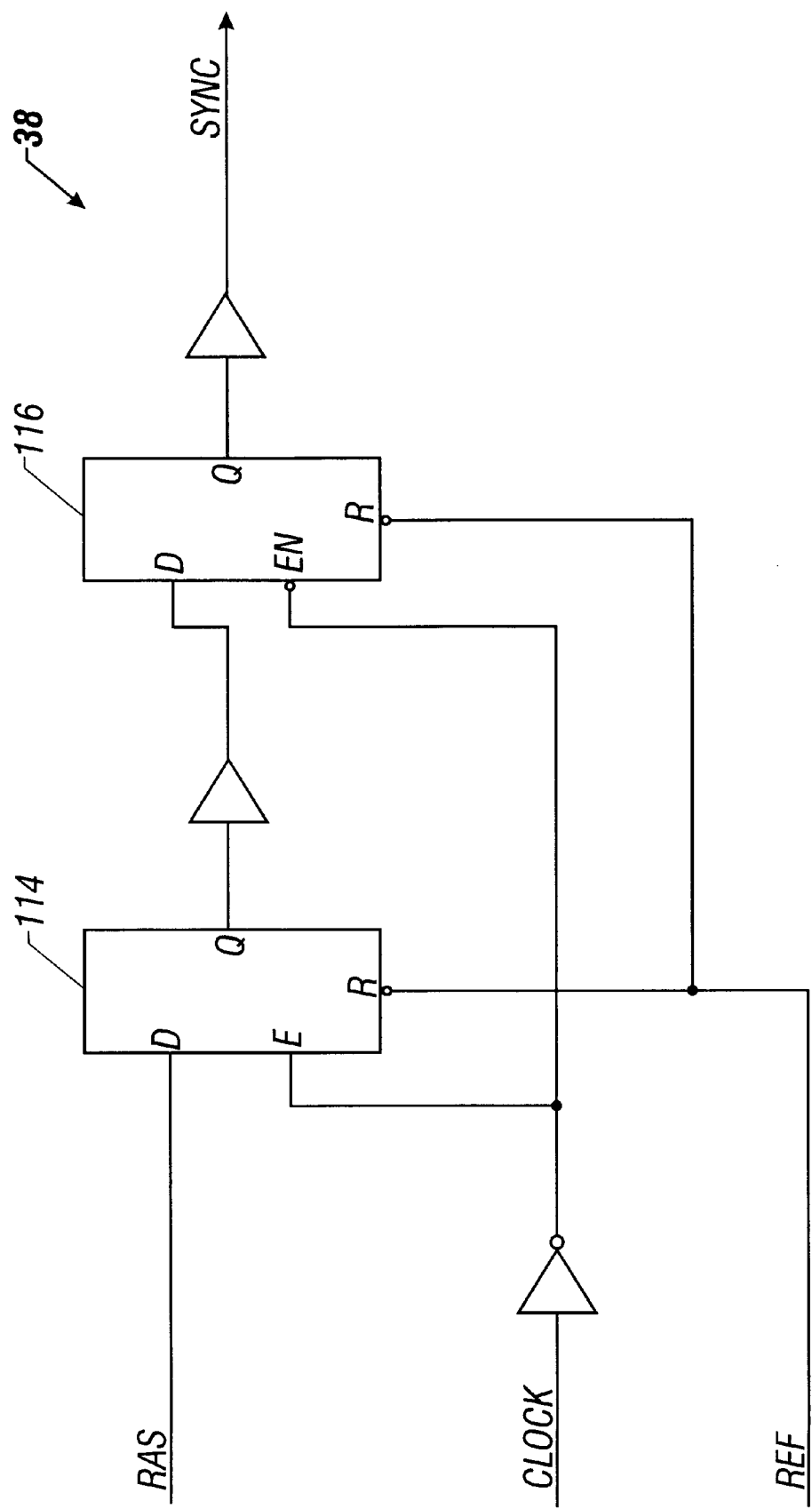
FIG. 7 is a schematic diagram of the RAS signal synchronizing circuit of FIG. 3.

Referring next to FIG. 7, the RAS synchronizing circuit 38 will now be described in greater detail. The RAS synchronizing circuit 38 is comprised of a pair of type D latches 114 and 116 with a Q output of the latch 114 tied to a D input of the latch 116. The CLOCK signal is tied to a "E" terminal of the latch 114, and to an "EN" terminal of latch 116. The REF signal is tied to a R terminal of the latches 114, 116. The RAS signal is input into a D input of latch 114 and the SYNC signal, which is the RAS signal synchronized with the CLOCK signal is output from a Q output of latch 116.

As can be seen from the above description of the present invention, there is provided a system for sequentially refreshing an expandable dynamic RAM memory which is easily adapted for optimum efficiency regardless of the size and/or configuration of the memory unit. The system may include a plural number of independent refresh sequence controllers such that the generation of refresh signals by one refresh sequence controller is not affected by the operation of any other refresh sequence controller. The refresh sequence generated by each independent refresh sequence controller is readily modified based on the number of memory cards included in the memory unit and on which of those memory cards are being serviced by the particular refresh sequence controller.

However, those skilled in the art will recognize that many modifications and variations besides those specifically mentioned may be made in the techniques described herein without departing substantially form the concept of the present invention. Accordingly, it should be clearly understood that the form of the invention described herein is exemplary only and is not intended as a limitation on the scope of the invention.

What is claimed is:

1. A digital computer having a system for controlling a refresh operation of a memory subsystem comprised of a memory unit having a series of dynamic RAM memory banks installed therein, comprising:

means for refreshing said memory banks; and means for selectively controlling an order in which said memory banks are refreshed;

said selective control means adjusting a temporal order in which said memory banks are refreshed as a function of (1) a number of memory units in said memory subsystem, (2) a number of dynamic RAM memory banks installed in each of said memory units and (3) a number of sides of SIMMs installed in each of said memory banks.

2. The computer as set forth in claim 1 wherein each of said memory unit further comprises a series of slots, said series of slots being grouped into first and second groups of slots, each said slot configured for installation of one of said memory banks therein and wherein said means for sequentially refreshing said memory banks further comprises:

a first refresh circuit for sequentially refreshing said memory banks installed in said first group of slots; and a second refresh circuit for sequentially refreshing said memory banks installed in said second group of slots.

3. The computer as set forth in claim 2 wherein said first refresh circuit further comprises a first multi-stage shift register having an output from each stage tied respectively to each of said memory banks installed in said first group of said slots, said first multi-stage shift register issuing refresh signals in sequential order to said memory banks installed in said first group of slots under control of said selective control means.

4. The computer as set forth in claim 3 wherein said second refresh circuit further comprises a second multi-stage shift register having an output from each stage tied respectively to each of said memory banks installed in said second group of slots, said second multi-stage shift register issuing refresh signals in sequential order to said memory banks installed in said second group of slots under control of said selective control means.

5. The computer as set forth in claim 4 wherein said means for sequentially refreshing said memory banks first activates said first refresh circuit under control of said selective control means, said second refresh circuit activated only after said first refresh circuit has refreshed said memory banks installed in said first group of slots.

6. The computer as set forth in claim 1 wherein said memory subsystem comprises a pair of memory units, each said memory unit having a series of slots, each of said slots configured for the installation of one of said memory banks therein.

7. The computer as set forth in claim 6 further comprising:

a first refresh circuit for sequentially refreshing said memory banks under control of said selective control means installed in a first group of said series of slots of said memory unit; and a second refresh circuit for sequentially refreshing under control of said selective control means said memory banks installed in a second group of said series of slots of said memory unit.

8. The computer as set forth in claim 7 wherein said first refresh circuit further comprises a first multi-stage shift register having an output from each stage tied respectively to memory banks installed in said first group of slots of said memory unit.

9. The computer as set forth in claim 7 further comprising a first wait circuit for issuing a first wait signal to a first memory refresh controller for refreshing said first memory unit.

10. The computer as set forth in claim 9 wherein said sequential refresh performed by said first refresh circuit occurs after said first wait circuit issues said first wait signal to said first memory refresh controller.

11. The computer as set forth in claim 10 wherein said first wait circuit further comprises a first wait multi-stage shift register having an output tied to said first memory refresh controller, said first wait multi-stage shift register issuing said first wait signal to said first memory refresh controller.

12. The computer as set forth in claim 10 wherein said second refresh circuit further comprises a second multi-stage shift register having an output from each stage tied respectively to each of said memory banks installed in said second group of slots of said memory unit controlled by said first memory refresh controller, said second multi-stage shift register issuing refresh signals in sequential order to said memory banks installed in said second group of memory banks.

13. The computer as set forth in claim 10 further comprising a second wait circuit for issuing a second wait signal to said memory refresh controller, said second wait signal generating a period of time approximately equal to the period of time required for said second refresh circuit to generate sequential refresh signals to said memory banks installed in said second group of slots after said memory banks installed in said first group of slots have been refreshed.

14. The computer as set forth in claim 13 wherein said refresh signals are generated by said second refresh circuit after said second wait circuit issues said second wait signal to said memory refresh controller.

15. The computer as set forth in claim 14 wherein said second wait circuit further comprises a second multi-stage wait shift register having an output tied to said first memory controller, said second multi-stage wait shift register issuing said second wait signal to said first memory refresh controller.

16. A method for controlling a refresh operation in a digital computer of a memory subsystem comprised of at least first and second memory units, each of said memory units having a series of slots configured for the installation of first and second groups of dynamic RAM memory banks therein, comprising the steps of:

refreshing said memory banks;

selectively controlling the order in which said memory banks are refreshed; and adjusting the temporal order in which said memory banks are refreshed as a function of (1) a number of memory units in said memory subsystem, (2) a number of dynamic RAM memory banks installed in each of said memory units and (3) a number of sides of SIMMs installed in each of said memory banks.

17. The method as set forth in claim 16 wherein said step of sequentially refreshing said memory banks further comprises the steps of:

first sequentially refreshing said memory banks installed in said first group of said slots of said first memory unit;

next sequentially refreshing said memory banks installed in said first group of said slots of said second memory unit;

next sequentially refreshing said memory banks installed in said second group of said slots of said first memory unit; and next sequentially refreshing said memory banks installed in said second group of said slots of said second memory unit.

18. The method as set forth in claim 17 further comprising the step of generating a first wait signal, said step of sequentially refreshing said memory banks installed in said first group of slots of said first memory unit occurring during the generation of said first wait signal.

19. The method as set forth in claim 18 further comprising the step of generating a second wait signal after sequentially refreshing said memory banks installed in said first group of slots of said first memory unit, said step of sequentially refreshing said memory banks installed in said first group of slots of said second memory unit occurring during the generation of said second wait signal.

20. The method as set forth in claim 19 further comprising the step of generating a third wait signal after sequentially refreshing said memory banks installed in said first group of slots of said second memory unit, said step of sequentially refreshing said memory banks installed in said second group of said slots of said first memory unit occurring during the generation of said third wait signal.

21. The method as set forth in claim 20 further comprising the step of generating a fourth wait signal after sequentially refreshing said memory banks installed in said second group of slots of said first memory unit, said step of sequentially refreshing said memory banks installed in said second group of slots of said second memory unit occurring during the generation of said fourth wait signal.

* * * * *